(12) United States Patent
Koski et al.

(10) Patent No.: US 8,093,890 B2
(45) Date of Patent: Jan. 10, 2012

(54) HALL-EFFECT SWITCH CIRCUIT ALLOWING LOW VOLTAGE OPERATION

(75) Inventors: Jack P. Koski, South Lyon, MI (US); Mark A. Vernacchia, Northville, MI (US)

(73) Assignee: GM Global Technology Operations LLC

( * ) Notice: Subject to any disclaimer, the term of this patent is extended or adjusted under 35 U.S.C. 154(b) by 296 days.

(21) Appl. No.: 12/355,042

(22) Filed: Jan. 16, 2009

(65) Prior Publication Data

US 2010/0109661 A1 May 6, 2010

Related U.S. Application Data

(60) Provisional application No. 61/109,631, filed on Oct. 30, 2008.

(51) Int. Cl.
*G01R 33/06* (2006.01)
*G01B 7/14* (2006.01)
(52) U.S. Cl. ..................................... 324/251; 324/207.2
(58) Field of Classification Search ............... 324/207.2, 324/251–252
See application file for complete search history.

(56) References Cited

U.S. PATENT DOCUMENTS

| | | | | |
|---|---|---|---|---|
| 4,833,406 A * | 5/1989 | Foster | .......................... | 324/225 |
| 5,604,433 A * | 2/1997 | Theus et al. | .................. | 324/251 |
| 5,796,355 A * | 8/1998 | Smigelski | ....................... | 341/33 |
| 6,362,618 B1 * | 3/2002 | Motz | ............................. | 324/251 |
| 6,777,932 B2 * | 8/2004 | Hara et al. | ..................... | 324/251 |
| 7,049,812 B2 * | 5/2006 | Hara et al. | ..................... | 324/251 |
| 7,242,187 B1 * | 7/2007 | Ku et al. | ........................ | 324/251 |
| 7,425,821 B2 * | 9/2008 | Monreal et al. | .......... | 324/117 H |
| 7,843,193 B2 * | 11/2010 | Huang | .......................... | 324/251 |
| 7,855,554 B2 * | 12/2010 | Oohira | ......................... | 324/251 |
| 7,923,997 B2 * | 4/2011 | Utsuno | ......................... | 324/251 |
| 2009/0009273 A1 * | 1/2009 | Ku | ................................. | 335/78 |

FOREIGN PATENT DOCUMENTS

JP 2000-206219 7/2000

\* cited by examiner

*Primary Examiner* — Huy Q Phan
*Assistant Examiner* — Joshua Benitez

(57) ABSTRACT

A hall-effect switching system comprises a hall-effect switch, a voltage comparison module, and a resistance bypass module. The voltage comparison module compares a supply voltage and a reference voltage. The resistance bypass module selectively adjusts a voltage output to the hall-effect switch based on the comparison.

17 Claims, 5 Drawing Sheets

HALL-EFFECT SWITCH CIRCUIT ALLOWING LOW VOLTAGE OPERATION

CROSS-REFERENCE TO RELATED APPLICATIONS

This application claims the benefit of U.S. Provisional Application No. 61/109,631, filed on Oct. 30, 2008. The disclosure of the above application is incorporated herein by reference.

FIELD

The present disclosure relates to hall-effect switching circuits and low voltage operation.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a functional block diagram of a hall-effect switching circuit is shown. A hall-effect switch 100 switches between current states. The current states are based on changes of a magnetic field near the hall-effect switch 100. One end of a sense resistance $R_1$ is connected to a low side of the hall-effect switch 100. Another end of the sense resistance $R_1$ is connected to ground. A voltage V is measured across the sense resistance $R_1$ to determine the current state provided by the hall-effect switch 100.

One end of a supply resistance $R_2$ is connected to a high side of the hall-effect switch 100. Another end of the supply resistance $R_2$ is connected to a voltage source, $V_s$. A supply voltage across the supply resistance $R_2$ is determined by the voltage $V_s$.

SUMMARY

A hall-effect switching system comprises a hall-effect switch, a voltage comparison module, and a resistance bypass module. The voltage comparison module compares a supply voltage and a reference voltage. The resistance bypass module selectively adjusts a voltage output to the hall-effect switch based on the comparison. In further features, the voltage comparison module determines when the supply voltage is less than or equal to the reference voltage, and adjusts the voltage output based on the determination. In other features, the reference voltage is adjusted based on the comparison.

In further features, the voltage comparison module determines when the supply voltage is greater than or equal to the adjusted reference voltage, and adjusts the voltage output based on the determination. In other features, the resistance bypass module increases the voltage output based on the comparison. In other features, the resistance bypass module includes a transistor and a resistance in parallel, and the transistor switches states based on the comparison.

In further features, the resistance bypass module includes a second transistor that selectively biases the transistor based on the comparison. In still further features, the voltage comparison module includes an operational amplifier that selectively biases the second transistor based on the comparison.

A hall-effect switching method comprises comparing a supply voltage and a reference voltage, and selectively adjusting a voltage output to a hall-effect switch based on the comparison. In further features, the hall-effect switching method further comprises determining when the supply voltage is less than or equal to the reference voltage, and adjusting the voltage output based on the determination. In other features, the hall-effect switching method further comprises adjusting the reference voltage based on the comparison.

In further features, the hall-effect switching method further comprises determining when the supply voltage is greater than or equal to the adjusted reference voltage, and adjusting the voltage output based on the determination. In other features, the hall-effect switching method further comprises increasing the voltage output based on the comparison. In still other features, the hall-effect switching method further comprises switching states of a transistor that is connected in parallel with a resistance based on the comparison.

In further features, the hall-effect switching method further comprises selectively biasing the transistor by switching states of a second transistor based on the comparison. In still further features, the hall-effect switching method further comprises adjusting an output of an operational amplifier based on the comparison, and selectively biasing the second transistor based on the output.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
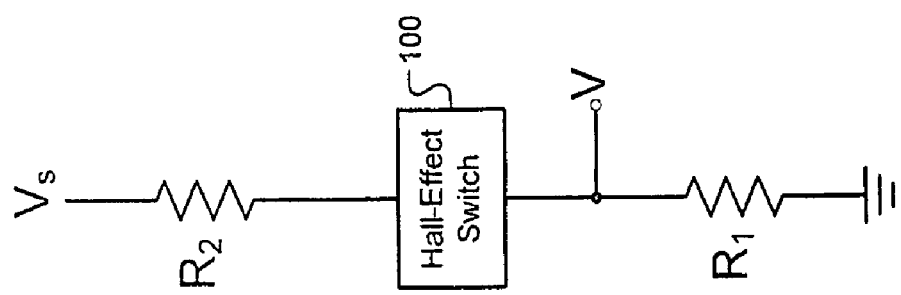
FIG. 1 is a functional block diagram of a hall-effect switching circuit according to the principles of the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

A hall-effect switching circuit may include a hall-effect switch, a voltage source, and resistances. The hall-effect switch changes current states based on changes of a magnetic field. The hall-effect switch switches between current states when the voltage across the hall-effect switch is greater than a minimum value. The minimum value depends on characteristics of the hall-effect switch. The voltage across the hall-effect switch depends on the values of the voltage source and the resistances connected to the hall-effect switch.

If the voltage across the hall-effect switch is less than the minimum value, then the hall-effect switch will not switch between current states. The voltage provided by the voltage source in the present disclosure is compared to a reference voltage. If the voltage from the voltage source is not greater than the reference voltage, then the voltage across the hall-effect switch may be increased to enable operation of the hall-effect switch.

Figure 2:
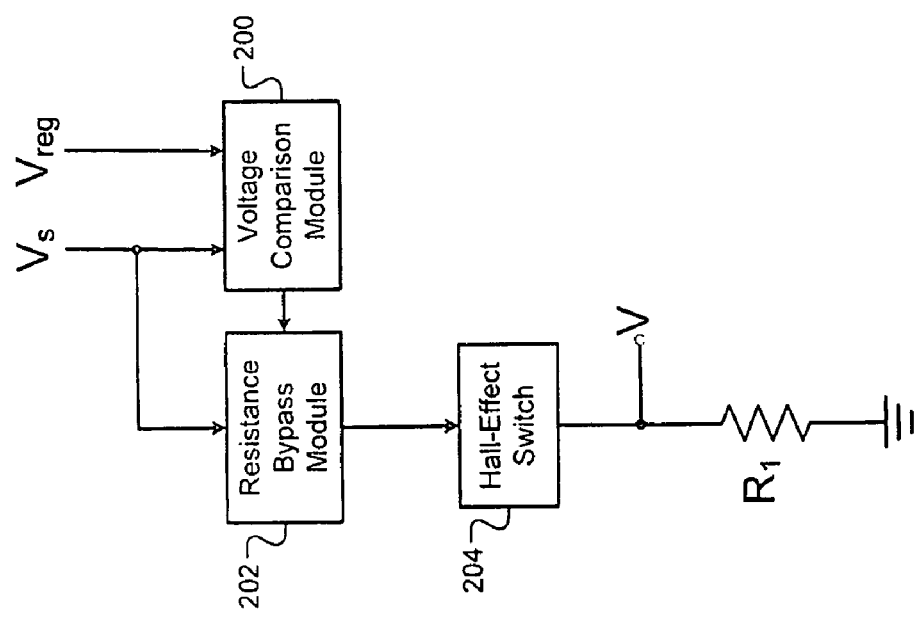
FIG. 2 is a functional block diagram of a hall-effect switching circuit according to the principles of the present disclosure.

Referring now to FIG. 2, a functional block diagram of a hall-effect switching circuit according to the principles of the present disclosure is shown. A voltage comparison module 200 compares a supply voltage $V_s$ to a reference voltage ($V_{reg}$). When $V_s$ is less than $V_{reg}$, a resistance bypass module 202 may allow a higher voltage applied to a hall-effect switch 204. For example only, the voltage comparison module 200 may trigger the resistance bypass module 202 when $V_s$ is less than $V_{reg}$. The resistance bypass module 202 may lower the resistance between $V_s$ and the hall-effect switch 204.

The voltage across the hall-effect switch 204 increases based on the lowered resistance. The voltage across the hall-effect switch 204 may be increased so that the hall-effect switch 204 may switch between the current states. A voltage V is measured across a sense resistance $R_1$ to determine the current state provided by the hall-effect switch 204.

Figure 3:
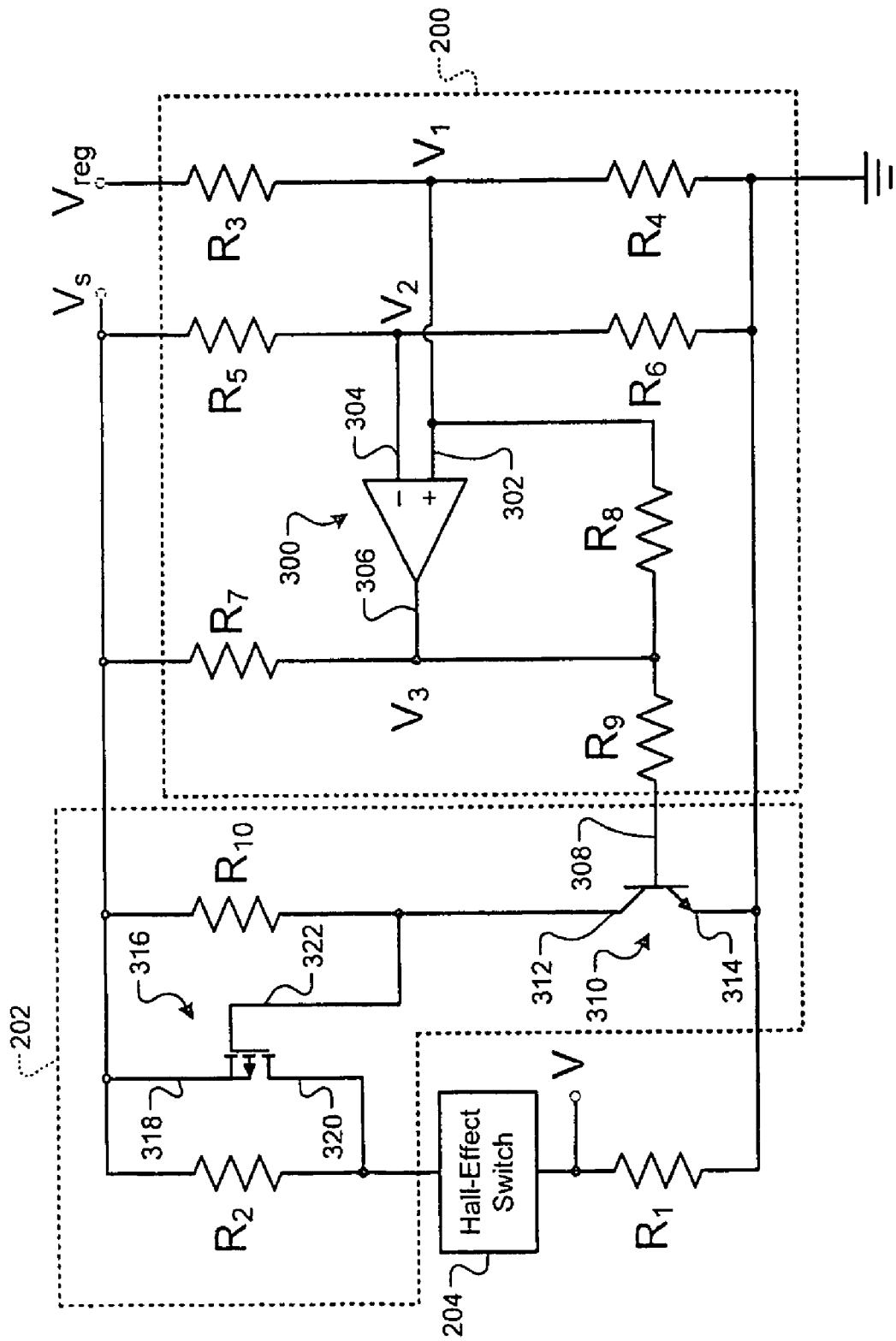
FIG. 3 is an exemplary circuit schematic of a hall-effect switching circuit according to the principles of the present disclosure.

Referring now to FIG. 3, an exemplary circuit schematic of a hall-effect switching circuit according to the principles of the present disclosure is shown. The voltage comparison module 200 may include voltage dividers, an operational amplifier 300, and resistances $R_3$, $R_4$, $R_5$, $R_6$, $R_7$, $R_8$, and $R_9$ to compare $V_s$ and $V_{reg}$. For example, $V_{reg}$ may be divided by resistances $R_3$ and $R_4$ to generate a voltage $V_1$. $V_s$ may be divided by resistances $R_5$ and $R_6$ to generate a voltage $V_2$. $V_1$ and $V_2$ may be compared by using other methods.

The operational amplifier 300 receives $V_1$ as an input to a non-inverting terminal 302 and $V_2$ as an input to an inverting input terminal 304. The operational amplifier 300 determines whether $V_2$ is greater than $V_1$. An output voltage $V_3$ of the operational amplifier 300 is based on whether voltage $V_2$ is greater than $V_1$.

A resistance $R_7$ is connected between an output terminal 306 of the operational amplifier 300 and $V_s$. A resistance $R_8$ is connected between the output terminal 306 and the non-inverting input terminal 302. A resistance $R_9$ is connected between the output terminal 306 and a base terminal 308 of a bi-polar junction transistor (BJT) 310. When the operational amplifier 300 determines that $V_2$ is less than or equal to $V_1$, then $V_3$ is high. If $V_2$ is greater than $V_1$, then $V_3$ is low. When $V_3$ is high, $V_1$ increases via feedback voltage across resistance $R_8$ (i.e. $V_1$ is adjusted based on $V_3$). In other implementations, $V_1$ may not be adjusted by $V_3$.

A resistance $R_{10}$ is connected between a collector terminal 312 of the BJT 310 and $V_s$. An emitter terminal 314 of the BJT 310 is connected to ground. When $V_3$ is generated, the BJT 310 is forward biased and in a saturation mode. The voltage at the collector terminal 312 of the BJT 310 decreases.

A p-channel metal-oxide-semiconductor field-effect transistor (MOSFET) 316 has a source terminal 318, a drain terminal 320, and a control terminal 322. The MOSFET 316 is connected in parallel with $R_2$. For example, the source terminal 318 is connected to $V_s$ and the drain terminal 320 is connected to a high side of the hall-effect switch 204. The control terminal 322 is connected to the collector terminal 312 of the BJT 310. When the collector terminal 312 voltage is lowered, the MOSFET 316 becomes biased to an on state. Accordingly, a resistance between the source terminal 318 and the drain terminal 320 decreases significantly.

When the resistance is lowered, $R_2$ is by-passed and the voltage supplied to the hall-effect switch 204 increases. In other words, the current will flow through the MOSFET 316 instead of the resistance $R_2$. $R_2$ may be by-passed until $V_s$ is greater than $V_{reg}$, or until $V_2$ is greater than $V_1$. The voltage V is measured across $R_1$ to determine the current state of the hall-effect switch 204.

Figure 4B:
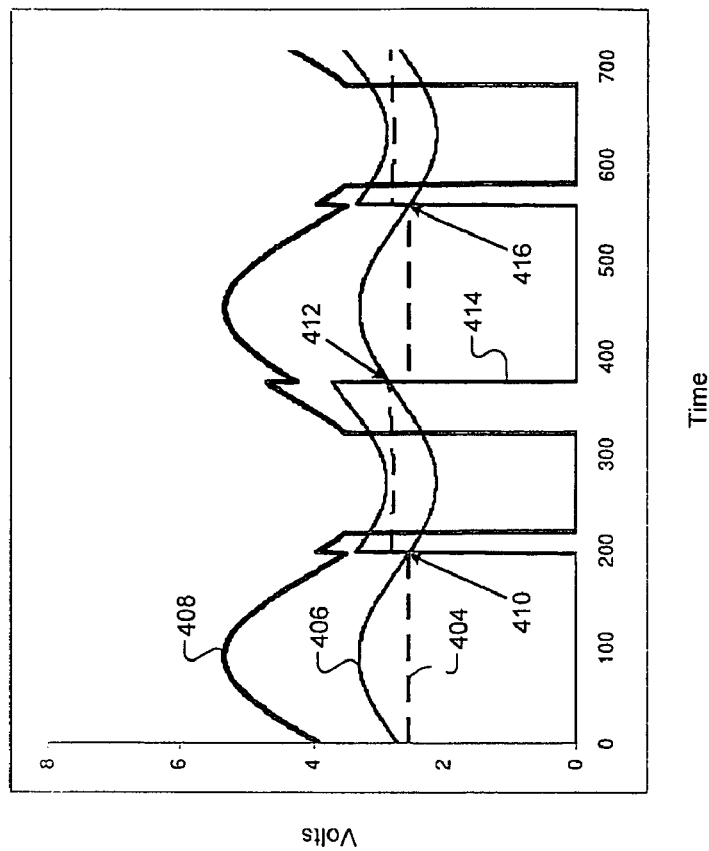
FIG. 4b is an exemplary graphical depiction of voltage measurements of a hall-effect switching circuit according to the principles of the present disclosure.
Figure 4A:
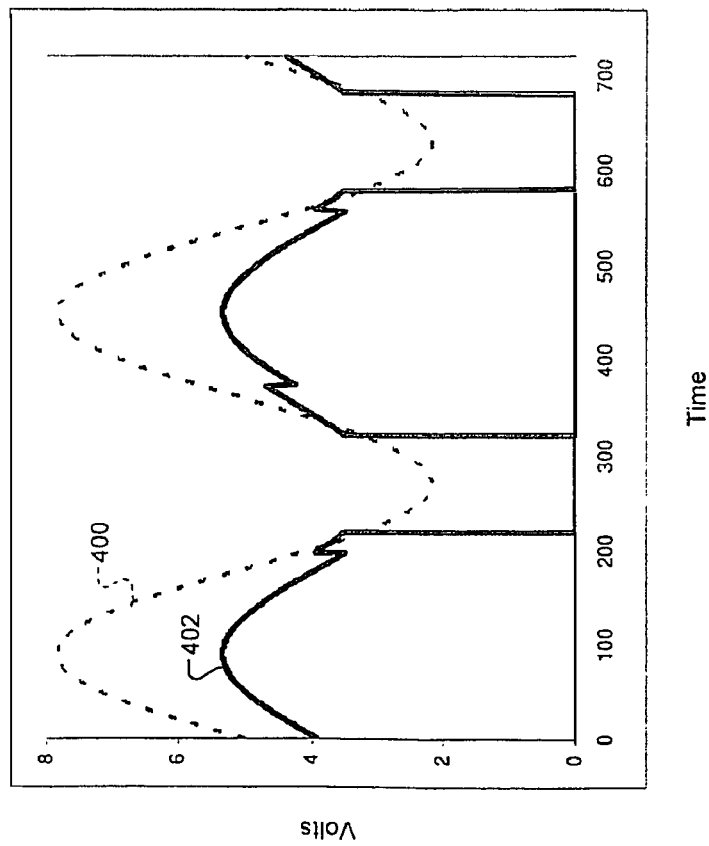
FIG. 4a is an exemplary graphical depiction of voltage measurements of a hall-effect switching circuit according to the principles of the prior art.

Referring now to FIG. 4a, an exemplary graphical depiction of voltage measurements of a hall-effect switching circuit according to the principles of the prior art is shown. A voltage supply line 400 depicts exemplary values of $V_s$. As $V_s$ changes, the voltage across the hall-effect switch 204 changes. A $V_H$ line 402 shows exemplary values of the voltage across the hall-effect switch 204. A disruption in the $V_H$ line 402 occurs when the voltage across the hall-effect switch 204 drops below a minimum value. For example only, the disruption is shown to occur between roughly 200 ms and 400 ms. During the disruption, the hall-effect switch 204 does not switch between current states.

Referring now to FIG. 4b, an exemplary graphical depiction of voltage measurements of a hall-effect switching circuit according to the principles of the present disclosure is shown. A reference voltage line 404 depicts exemplary values of $V_1$. A voltage supply line 406 represents exemplary possible values of $V_2$. $V_2$ and $V_1$ are compared to determine whether voltage compensation is needed.

When the voltage $V_2$ line 406 decreases below the reference voltage line 404, a disruption occurs in a $V_H$ line 408. For example only, a starting point 410 shows that the voltage $V_2$ line 406 crosses the reference voltage line 404 at roughly 200 ms. The disruption is compensated for by $V_3$ going high during the period between the starting point 410 and an ending point 412.

At the starting point 410, $V_3$ goes high because the voltage $V_2$ line 406 has dropped below the reference voltage line 404. A voltage compensation line 414 represents exemplary values of $V_3$. When $V_3$ is high, the $V_H$ line 408 appears to not have a disruption because the voltage compensation line 414 fills in the missing portion of the $V_H$ line 408. $V_3$ continues to be high until the voltage $V_2$ line 406 is greater than the reference voltage line 404. For example only, the voltage $V_2$ line 406 is greater than the reference voltage line 404 between the ending point 412 and a second starting point 416.

In FIG. 4b, the reference voltage line 404 rises to a higher voltage when $V_3$ is high. Because the reference voltage line 404 rises to a higher voltage level when $V_3$ is high, the starting point 410 and the ending point 412 are at different voltage levels. In various implementations, the starting point 410 and the ending point 412 may be at the same voltage level.

Figure 5:
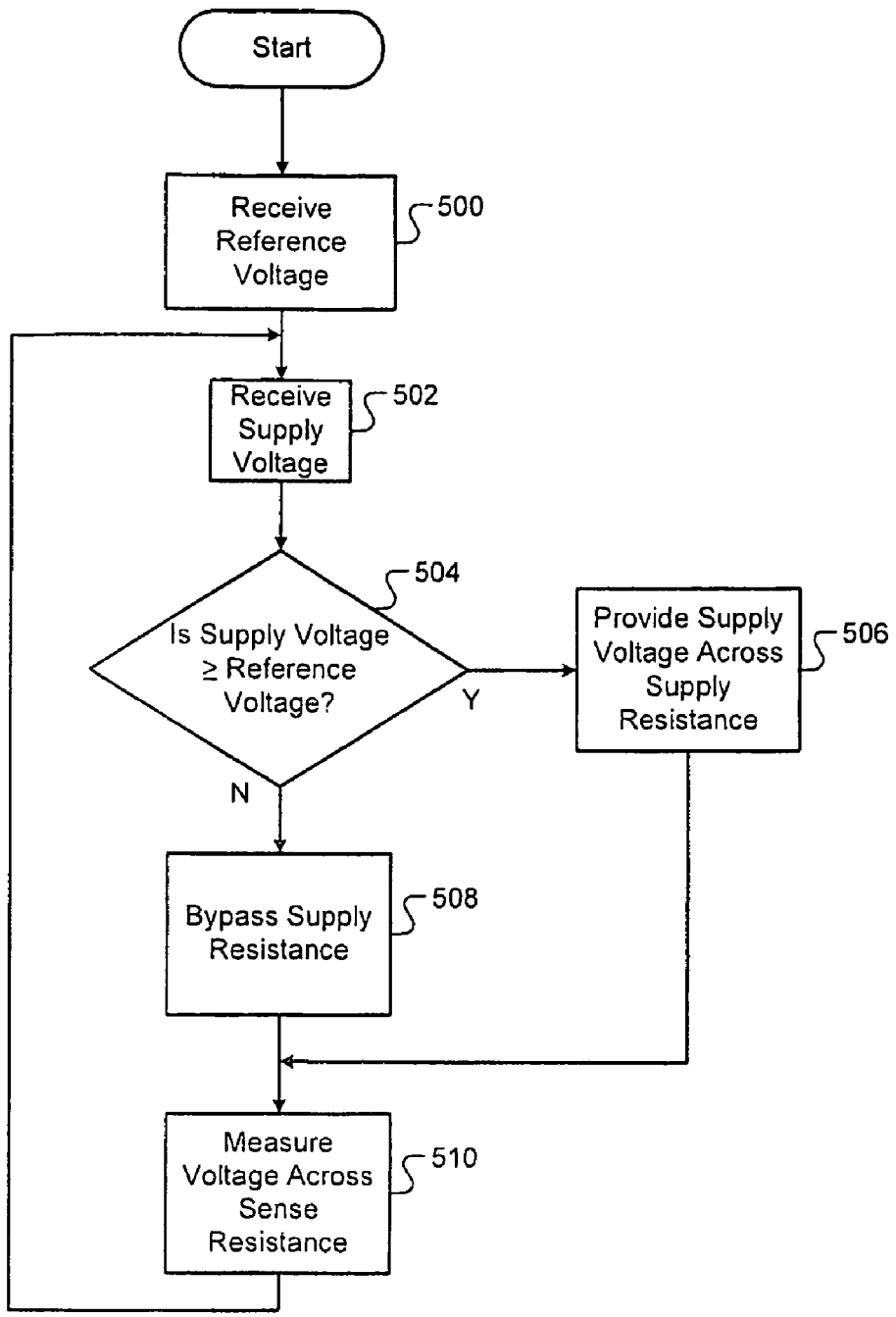
FIG. 5 is a flowchart depicting exemplary steps performed by a hall-effect switching circuit according to the principles of the present disclosure.

Referring now to FIG. 5, a flowchart depicting exemplary steps performed by a hall-effect switching circuit according to the principles of the present disclosure is shown. Control begins in step 500. In step 500, control receives the reference voltage. In step 502, control receives the supply voltage. In step 504, control determines whether the supply voltage is greater than the reference voltage. If the supply voltage is greater than the reference voltage, then control transfers to step 506; otherwise, control transfers to step 508.

In step 506, control provides the supply voltage across the supply resistance. In step 508, control bypasses the supply resistance. In step 510, control measures the voltage across the sense resistance.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A hall-effect switching system comprising:
   a hall-effect switch that enables and disables current flow between an input of said hall-effect switch and an output of said hall-effect switch;
   a voltage comparison module that compares a supply voltage and a reference voltage; and
   a resistance bypass module that selectively adjusts a voltage at said input of said hall-effect switch based on said comparison,
   wherein said resistance bypass module includes a transistor and a resistance in parallel, wherein said transistor switches states based on said comparison.

2. The hall-effect switching system of claim 1 wherein said voltage comparison module determines when said supply voltage is less than or equal to said reference voltage, and adjusts said voltage at said input based on said determination.

3. The hall-effect switching system of claim 1 wherein said reference voltage is adjusted based on said comparison.

4. The hall-effect switching system of claim 3 wherein said voltage comparison module determines when said supply voltage is greater than or equal to said adjusted reference voltage, and adjusts said voltage at said input based on said determination.

5. The hall-effect switching system of claim 1 wherein said resistance bypass module increases said voltage at said input based on said comparison.

6. The hall-effect switching system of claim 1 wherein said resistance bypass module includes a second transistor, wherein said second transistor selectively biases said transistor based on said comparison.

7. The hall-effect switching system of claim 6 wherein said voltage comparison module includes an operational amplifier that selectively biases said second transistor based on said comparison.

8. A hall-effect switching method comprising:
   comparing a supply voltage and a reference voltage; and
   selectively adjusting a voltage at an input of a hall-effect switch based on said comparison,
   wherein said hall-effect switch enables and disables current flow between said input of said hall-effect switch and an output of said hall-effect switch, and
   wherein said adjusting said voltage at said input comprises switching states of a transistor that is connected in parallel with a resistance based on said comparison.

9. The hall-effect switching method of claim 8 further comprising:
   determining when said supply voltage is less than or equal to said reference voltage; and
   adjusting said voltage at said input based on said determination.

10. The hall-effect switching method of claim 8 further comprising:
    adjusting said reference voltage based on said comparison.

11. The hall-effect switching method of claim 10 further comprising:
    determining when said supply voltage is greater than or equal to said adjusted reference voltage; and
    adjusting said voltage at said input based on said determination.

12. The hall-effect switching method of claim 8 further comprising:
    increasing said voltage at said input based on said comparison.

13. The hall-effect switching method of claim 8 further comprising:
    selectively biasing said transistor by switching states of a second transistor based on said comparison.

14. The hall-effect switching method of claim 13 further comprising:
    adjusting an output of an operational amplifier based on said comparison; and
    selectively biasing said second transistor based on said output of said operational amplifier.

15. A hall-effect switching system comprising:
    a hall-effect switch;
    a voltage comparison module that compares a supply voltage and a reference voltage; and
    a resistance bypass module that selectively adjusts a voltage output to said hall-effect switch based on said comparison,
    wherein said resistance bypass module includes a transistor and a resistance in parallel, and
    wherein said transistor switches states based on said comparison.

16. The hall-effect switching system of claim 15 wherein said resistance bypass module includes a second transistor, wherein said second transistor selectively biases said transistor based on said comparison.

17. The hall-effect switching system of claim 16 wherein said voltage comparison module includes an operational amplifier that selectively biases said second transistor based on said comparison.

* * * * *